United States Patent
Takeuchi et al.

(10) Patent No.: US 11,191,192 B2
(45) Date of Patent: Nov. 30, 2021

(54) ELECTRIC POWER CONVERSION APPARATUS

(71) Applicant: DENSO CORPORATION, Kariya (JP)

(72) Inventors: Kazuya Takeuchi, Kariya (JP); Ryota Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/396,814

(22) Filed: Apr. 29, 2019

(65) Prior Publication Data

US 2019/0335629 A1 Oct. 31, 2019

(30) Foreign Application Priority Data

Apr. 27, 2018 (JP) .............................. JP2018-087263

(51) Int. Cl.
| | |
|---|---|
| *H05K 7/20* | (2006.01) |
| *H01L 23/473* | (2006.01) |
| *H01L 25/11* | (2006.01) |

(52) U.S. Cl.
CPC ....... *H05K 7/20927* (2013.01); *H01L 23/473* (2013.01); *H01L 25/117* (2013.01)

(58) Field of Classification Search
CPC . H05K 7/20927; H01L 25/117; H01L 23/473; H01L 23/40; H01L 23/4012; H01L 25/16

(Continued)

(56) References Cited

U.S. PATENT DOCUMENTS 7,200,007 B2 *  4/2007  Yasui  .................... H02M 7/003
                                                      165/80.4
9,713,293 B2 *  7/2017  Takeuchi  ........... H05K 7/20927
(Continued)

FOREIGN PATENT DOCUMENTS

JP    2016005424  A  *  1/2016
JP    2016105671  A  *  6/2016

OTHER PUBLICATIONS

Tachibana, Hideaki, "Power Conversion Equipment", Jan. 12, 2016, Denso Corp., Entire Document (Translation of JP 2016005424). (Year: 2016).*

(Continued)

*Primary Examiner* — Stephen S Sul
(74) *Attorney, Agent, or Firm* — Oliff PLC

(57) ABSTRACT

In an electric power conversion apparatus, a semiconductor module-cooler unit includes a semiconductor module and a cooler that has cooling pipes stacked with the semiconductor module in a stacking direction. A flow path forming component includes an electronic component main body and has an in-component flow path formed therein. A case receives both the semiconductor module-cooler unit and the flow path forming component therein. A pressure-applying member is arranged in the case to apply pressure to the semiconductor module-cooler unit from a rear side toward a front side in the stacking direction. Moreover, the flow path forming component is fixed to the case. The pressure-applying member, the semiconductor module-cooler unit and the flow path forming component are arranged in alignment with each other in the stacking direction. An in-cooler flow path formed in the cooler and the in-component flow path are fluidically connected with each other in the stacking direction.

4 Claims, 7 Drawing Sheets

(58) Field of Classification Search
USPC .................................. 361/689, 699, 702, 715
See application file for complete search history.

(56) References Cited

U.S. PATENT DOCUMENTS

| | | | | |
|---|---|---|---|---|
| 2012/0250380 | A1* | 10/2012 | Ichijyo ............... | H05K 7/20927 |
| | | | | 363/123 |
| 2014/0001630 | A1* | 1/2014 | Takamura ............. | H01L 25/112 |
| | | | | 257/719 |
| 2014/0098496 | A1* | 4/2014 | Nakasaka ............. | H01L 23/473 |
| | | | | 361/699 |
| 2014/0284765 | A1* | 9/2014 | Kiuchi .................... | H01L 28/40 |
| | | | | 257/532 |
| 2015/0189790 | A1* | 7/2015 | Tachibana .......... | H05K 7/20254 |
| | | | | 361/699 |
| 2016/0073556 | A1* | 3/2016 | Nakasaka ............. | H01L 23/473 |
| | | | | 361/699 |
| 2016/0079145 | A1* | 3/2016 | Nakagawa ................ | G06F 1/20 |
| | | | | 361/699 |
| 2016/0128216 | A1* | 5/2016 | Harada ................ | H05K 7/1432 |
| | | | | 361/728 |
| 2016/0227677 | A1* | 8/2016 | Hirasawa ........... | H05K 7/20927 |
| 2016/0241155 | A1* | 8/2016 | Takeuchi ........... | H05K 7/20927 |
| 2016/0254206 | A1* | 9/2016 | Ohno ...................... | H01L 23/40 |
| | | | | 363/132 |
| 2016/0286687 | A1* | 9/2016 | Tajima .................... | H01L 23/40 |
| 2017/0141082 | A1* | 5/2017 | Hirasawa ........... | H05K 7/20927 |
| 2018/0070480 | A1* | 3/2018 | Hirasawa .............. | B60L 15/007 |

OTHER PUBLICATIONS

Nakamiya, Tatsuya; Omura, Shinji, "Power Conversion Device", Jun. 9, 2016, Denso Corp., Entire Document (Translation of JP 2016105671). (Year: 2016).*

* cited by examiner

ELECTRIC POWER CONVERSION APPARATUS

CROSS-REFERENCE TO RELATED APPLICATION

This application is based on and claims priority from Japanese Patent Application No. 2018-87263 filed on Apr. 27, 2018, the contents of which are hereby incorporated by reference in their entirety into this application.

BACKGROUND

1 Technical Field

The present disclosure relates to electric power conversion apparatuses.

2 Description of Related Art

There is known an electric power conversion apparatus which includes a plurality of semiconductor modules, a reactor and a cooler for cooling the semiconductor modules and the reactor. Specifically, the cooler includes a plurality of cooling pipes that are stacked with the semiconductor modules and the reactor in a stacking direction to form a stacked body. Moreover, on one side of the stacked body in the stacking direction, there is provided a pressure-applying member to apply pressure to the stacked body in the stacking direction. Consequently, under the pressure applied by the pressure-applying member, the electronic components (i.e., the semiconductor modules and the reactor) are brought into intimate contact with the cooling pipes of the cooler, thereby improving the efficiency of cooling the electronic components by the cooler.

SUMMARY

According to the present disclosure, there is provided an electric power conversion apparatus which includes a semiconductor module-cooler unit, a flow path forming component, a case and a pressure-applying member. The semiconductor module-cooler unit includes a semiconductor module and a cooler. The semiconductor module has a semiconductor element built therein. The cooler has a plurality of cooling pipes stacked with the semiconductor module in a stacking direction to cool the semiconductor module. The flow path forming component includes an electronic component main body and has an in-component flow path formed therein. The electronic component main body is electrically connected with the semiconductor module. The in-component flow path, through which a coolant flows to cool the electronic component main body, is formed integrally with the electronic component main body. The case receives both the semiconductor module-cooler unit and the flow path forming component therein. The pressure-applying member is arranged in the case to apply pressure to the semiconductor module-cooler unit from a rear side toward a front side in the stacking direction. Moreover, in the electric power conversion apparatus, the flow path forming component is fixed to the case. The pressure-applying member, the semiconductor module-cooler unit and the flow path forming component are arranged in alignment with each other in the stacking direction. An in-cooler flow path, which is formed in the cooler, and the in-component flow path are fluidically connected with each other in the stacking direction.

DESCRIPTION OF EMBODIMENTS

Figure 1:
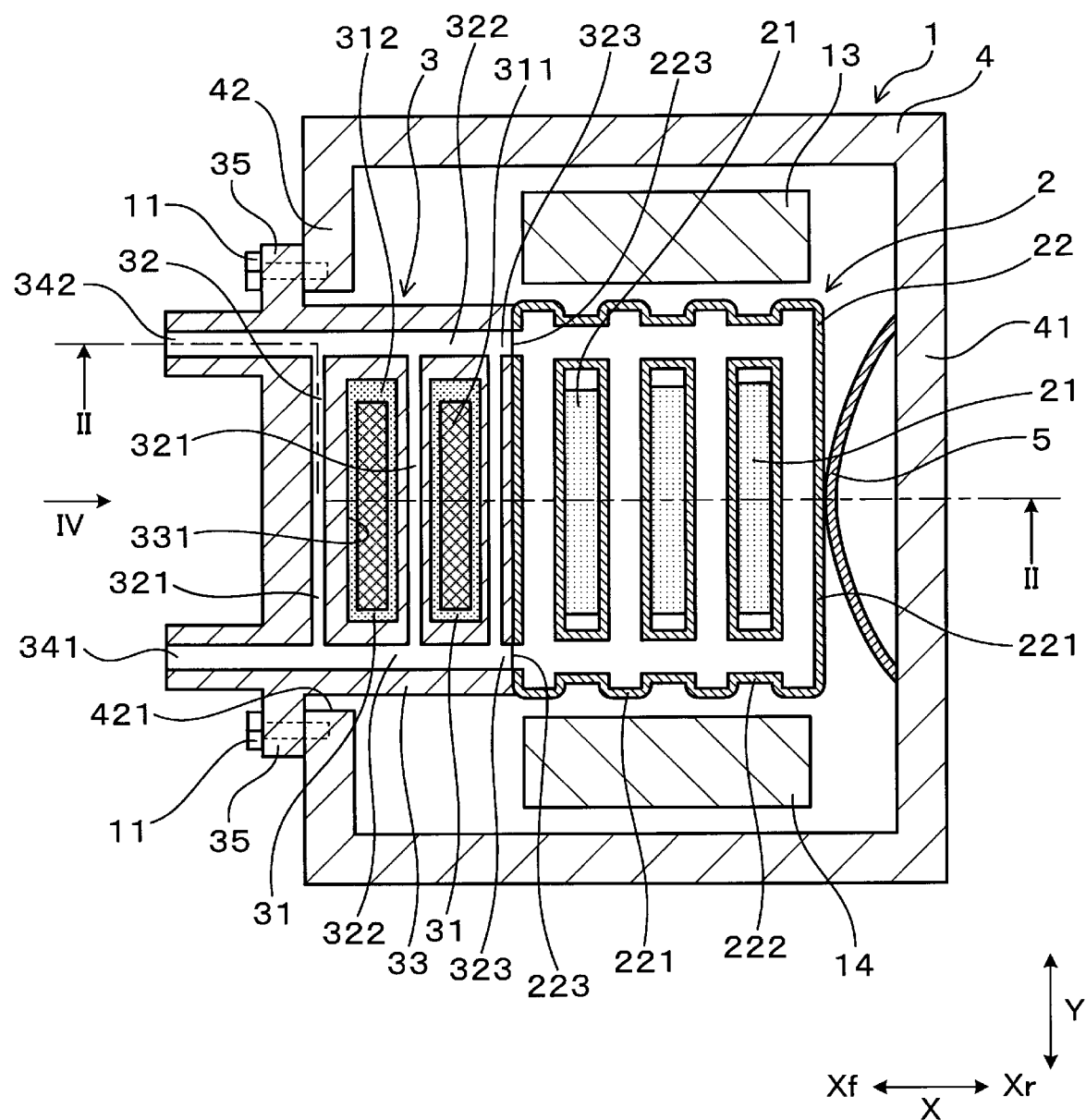
FIG. 1 is a schematic cross-sectional view illustrating the overall structure of an electric power conversion apparatus according to a first embodiment.

The inventors of the present application have found the following problem with the known electric power conversion apparatus described previously.

When the known electric power conversion apparatus vibrates in a direction perpendicular to the stacking direction, the electronic components may be displaced relative to the cooling pipes, thereby lowering the efficiency of cooling the electronic components by the cooler.

As a counter-measure to vibration of the known electric power conversion apparatus, at least some of the electronic components may be fixed to a case that receives the stacked body therein.

However, when at least some of the electronic components are fixed to the case, it is impossible for the pressure-applying member to apply pressure to the stacked body over the entire range thereof in the stacking direction. More specifically, it is impossible for the pressure-applying member to apply pressure to those of the electronic components which are located on the opposite side of the at least some of the electronic components to the pressure-applying member in the stacking direction. Consequently, it is difficult to improve the efficiency of cooling the at least some of the electronic components, which are fixed to the case, from the opposite side thereof to the pressure-applying member in the stacking direction; it is also difficult to improve the efficiency of cooling those of the electronic components which are located on the opposite side of the at least some of the electronic components to the pressure-applying member in the stacking direction.

To solve the above problem, two pressure-applying members may be provided respectively on opposite sides of the stacked body in the stacking direction to apply pressure to the stacked body.

However, with the employment of the two pressure-applying members, both the parts count and the size of the known electric power conversion apparatus would be increased.

In contrast, the above-described electric power conversion apparatus according to the present disclosure has the following advantages.

Since the flow path forming component is fixed to the case, it is prevented from being displaced in the case even when the electric power conversion apparatus vibrates. Consequently, the vibration resistance of the electric power conversion apparatus can be secured.

Moreover, it is unnecessary to apply pressure between the electronic component main body and the in-component flow path for cooling the electronic component main body. In other words, it is possible to cool the electronic component main body without applying pressure to the flow path forming component. Consequently, it becomes unnecessary to provide the pressure-applying member on each side of the semiconductor module-cooler unit in the stacking direction. That is, it becomes possible to provide the pressure-applying member only on the opposite side of the semiconductor module-cooler unit to the flow path forming component in the stacking direction. As a result, it becomes possible to minimize the size of the electric power conversion apparatus.

Furthermore, with the pressure-applying member, the semiconductor module-cooler unit and the flow path forming component arranged in alignment with each other in the stacking direction, it becomes possible for the pressure-applying member to apply pressure to the semiconductor module-cooler unit in the stacking direction, thereby improving the efficiency of cooling the semiconductor module by the cooler.

Furthermore, since the in-cooler flow path and the in-component flow path are fluidically connected with each other in the stacking direction, it becomes unnecessary to provide both a coolant inlet and a coolant outlet for each of the in-cooler flow path and the in-component flow path individually. That is, it becomes possible to provide both a coolant inlet and a coolant outlet only for the in-component flow path. In addition, since the semiconductor module-cooler unit and the flow path forming component are arranged in alignment with each other in the stacking direction, it becomes possible to fluidically connect the in-cooler flow path and the in-component flow path in the stacking direction without increasing the overall length of the electric power conversion apparatus in the stacking direction. As a result, it becomes possible to facilitate minimization of the size of the electric power conversion apparatus.

To sum up, according to the present disclosure, it becomes possible to provide the electric power conversion apparatus which is high in both vibration resistance and cooling efficiency and small in size.

Exemplary embodiments will be described hereinafter with reference to FIGS. 1-9. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

Figure 2:
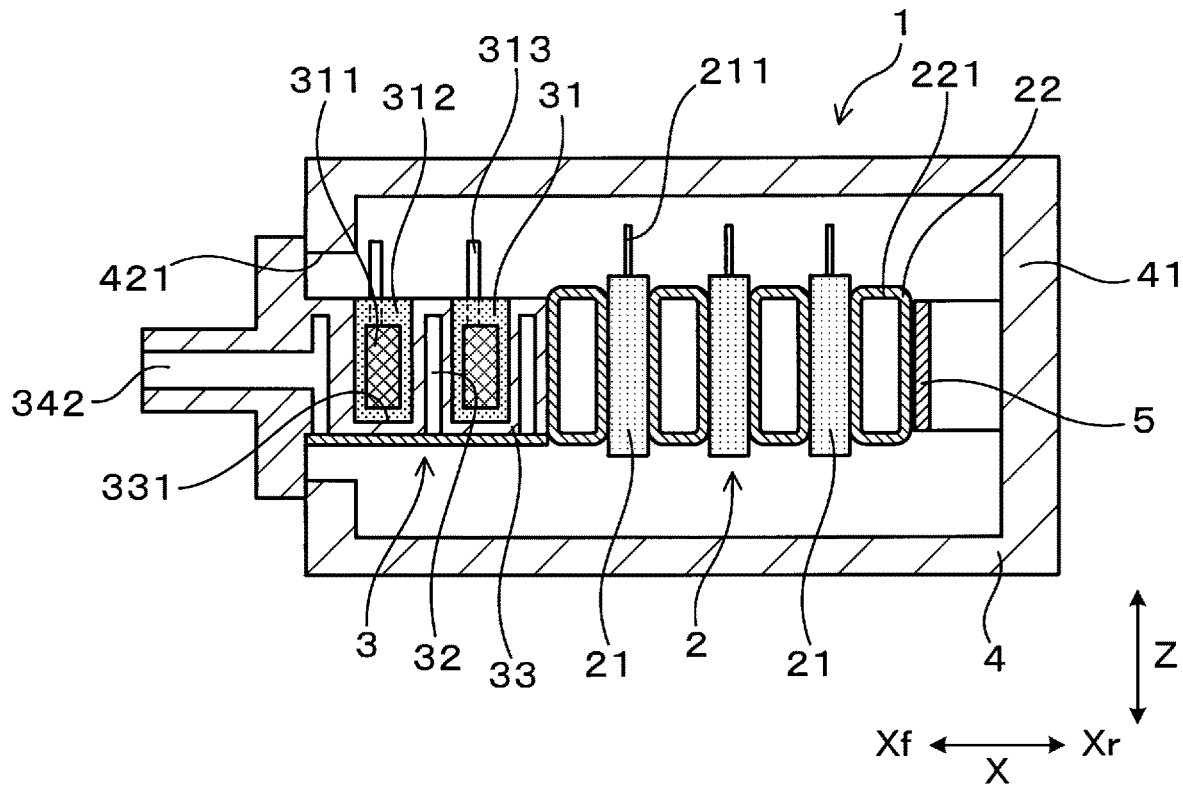
FIG. 2 is a cross-sectional view of the electric power conversion apparatus according to the first embodiment taken along the line II-II in FIG. 1.

FIGS. 1 and 2 show the overall structure of an electric power conversion apparatus 1 according to the first embodiment.

In the present embodiment, the electric power conversion apparatus 1 is designed to be used in, for example, a vehicle such as an electric vehicle or a hybrid vehicle. Moreover, the electric power conversion apparatus 1 is configured to be electrically connected, for example, between a battery and an AC motor to perform electric power conversion between DC power and AC power.

As shown in FIGS. 1 and 2, the electric power conversion apparatus 1 includes a semiconductor module-cooler unit 2, a flow path forming component 3, a case (or housing) 4 and a pressure-applying member 5.

Figure 3:
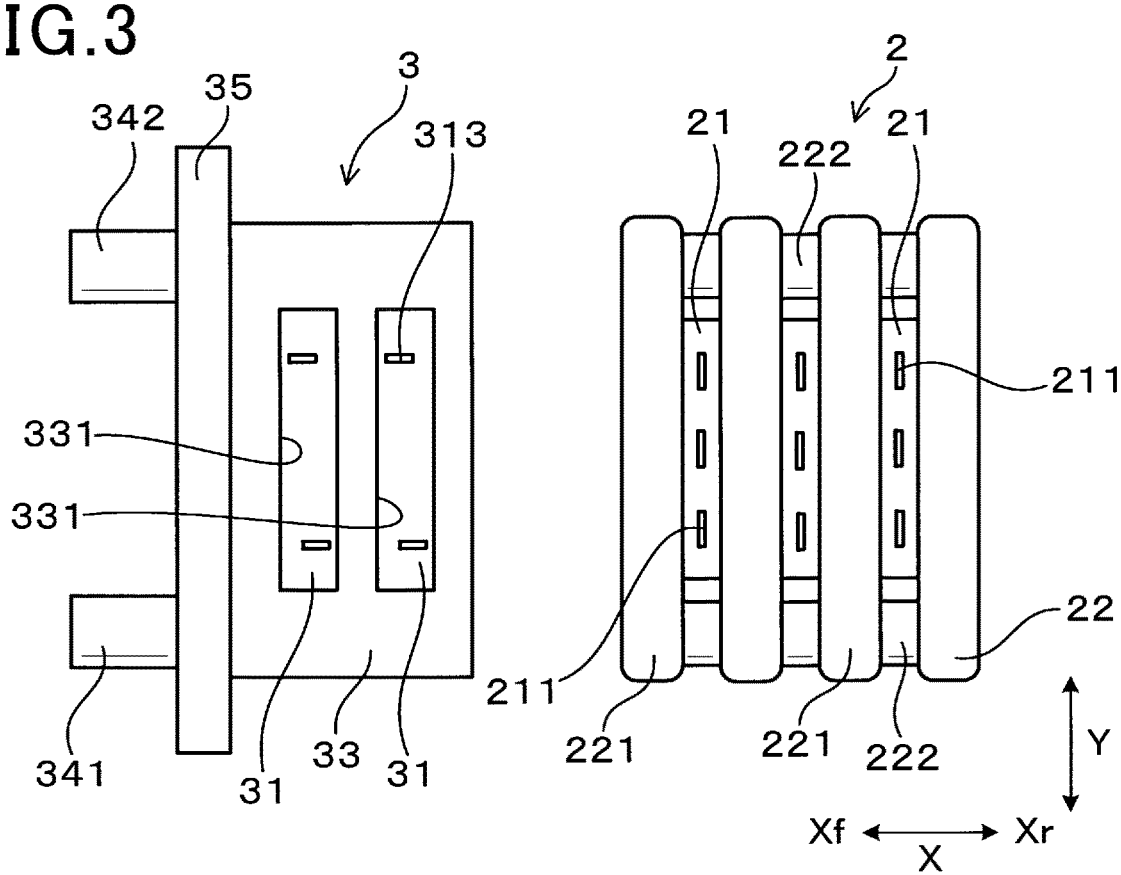
FIG. 3 is a plan view of both a semiconductor module-cooler unit and a flow path forming component of the electric power conversion apparatus according to the first embodiment.

Referring further to FIG. 3 in addition to FIGS. 1 and 2, the semiconductor module-cooler unit 2 includes a plurality of semiconductor modules 21 and a cooler 22. The cooler 22 has a plurality of cooling pipes 221 stacked with the semiconductor modules 21 in a stacking direction X to cool the semiconductor modules 21.

The flow path forming component 3 includes a plurality (more particularly, two in the present embodiment) of electronic component main bodies 31 and has an in-component flow path 32 formed therein. The electronic component main bodies 31 are electrically connected with the semiconductor modules 21. The in-component flow path 32, through which a coolant flows to cool the electronic component main bodies 31, is formed integrally with the electronic component main bodies 31 into the flow path forming component 3.

As shown in FIGS. 1 and 2, the case 4 receives both the semiconductor module-cooler unit 2 and the flow path forming component 3 therein. Moreover, in the case 4, there is arranged the pressure-applying member 5 on a rear side Xr of the semiconductor module-cooler unit 2 to apply pressure to the semiconductor module-cooler unit 2 from the rear side Xr toward a front side Xf (or forward) in the stacking direction X.

The flow path forming component 3 is fixed to the case 4. Moreover, in the case 4, the pressure-applying ember 5, the semiconductor module-cooler unit 2 and the flow path forming component 3 are arranged in alignment with each other in the stacking direction X. Furthermore, an in-cooler flow path, which is formed in the cooler 22 of the semiconductor module-cooler unit 2, is fluidically connected with the in-component flow path 32 in the stacking direction X.

As shown in FIGS. 1-3, in the semiconductor module-cooler unit 2, the semiconductor modules 21 are stacked alternately with the cooling pipes 221 of the cooler 22 in the stacking direction X.

Each of the semiconductor modules 21 has a semiconductor element built therein. The semiconductor element may be, for example, an IGBT (Insulated Gate Bipolar Transistor) or a MOSFET (Metal-Oxide-Semiconductor Field-Effect Transistor). Moreover, as shown in FIGS. 2 and 3, each of the semiconductor modules 21 has a plurality of power terminals 211 protruding in a protruding direction Z that is perpendicular to the stacking direction X.

As shown in FIGS. 1 and 3, each of the cooling pipes 221 is shaped to be long in a longitudinal direction Y thereof; the longitudinal direction Y is perpendicular to both the stacking direction X and the protruding direction Z. Moreover, each of the cooling pipes 221 is configured to allow the coolant to flow therethrough from one end to the other end thereof in the longitudinal direction Y.

For every two of the cooling pipes 221 adjacent to each other in the stacking direction X, end portions of the two cooling pipes 221 on one side in the longitudinal direction Y are connected both mechanically and fluidically with each other by one connecting pipe 222; end portions of the two cooling pipes 221 on the other side in the longitudinal direction Y are also connected both mechanically and fluidically with each other by another connecting pipe 222. That is, flow paths formed in the two cooling pipes 221 are fluidically connected with each other by the two connecting pipes 222. In this manner, all of the cooling pipes 221 and the connecting pipes 222 together constitute the cooler 22.

In the present embodiment, the cooler 22 is made of a metal such as aluminum. Moreover, between each adjacent pair of the cooling pipes 221 of the cooler 22, there is sandwiched (or fixedly held) one of the semiconductor modules 21. In this manner, the semiconductor modules 21 and the cooler 22 together constitute the semiconductor module-cooler unit 2.

In the present embodiment, the pressure-applying member 5 is implemented by a plate spring. However, the implementation of the pressure-applying member 5 is not particularly limited. For example, the pressure-applying member 5 may alternatively be implemented by a coil spring.

The pressure-applying member 5 is interposed between an internal wall surface of the case 4 and the semiconductor module-cooler unit 2 in the stacking direction X. More specifically, the pressure-applying member 5 is arranged between an inner surface of a rear wall 41 of the case 4 and that one of the cooling pipes 221 which is located at a rear end of the cooler 22. Consequently, pressure is applied toward the front side Xf in the stacking direction X by the pressure-applying member 5 to a rear end surface of the semiconductor module-cooler unit 2.

That is, the pressure-applying member 5 is interposed, in a state of being elastically compressed in the stacking direction X, between the rear wall 41 of the case 4 and the semiconductor module-cooler unit 2. Consequently, the restoring force of the pressure-applying member 5 acts on the semiconductor module-cooler unit 2, thereby applying pressure to the semiconductor module-cooler unit 2 in the stacking direction X.

It should be noted that an additional plate member having high rigidity may be interposed between the pressure-applying member 5 and the semiconductor module-cooler unit 2. It also should be noted that an additional bearing member may be interposed between the pressure-applying member 5 and the rear wall 41 of the case 4.

The flow path forming component 3 is arranged on the front side Xf of the semiconductor module-cooler unit 2 in the stacking direction X so that a front end surface of the semiconductor module-cooler unit 2 abuts a rear end surface of the flow path forming component 3. In other words, the flow path forming component 3 is arranged to abut the front end surface of the semiconductor module-cooler unit 2.

As shown in FIG. 1, the flow path forming component 3 is fixed to the case 4 by at least one fastening member 11, more particularly a plurality of fastening members 11 in the present embodiment.

In the present embodiment, each of the fastening members 11 is implemented by a bolt. Moreover, the fastening direction of the fastening members 11 is toward the rear side Xr (or backward) in the stacking direction X.

Figure 4:
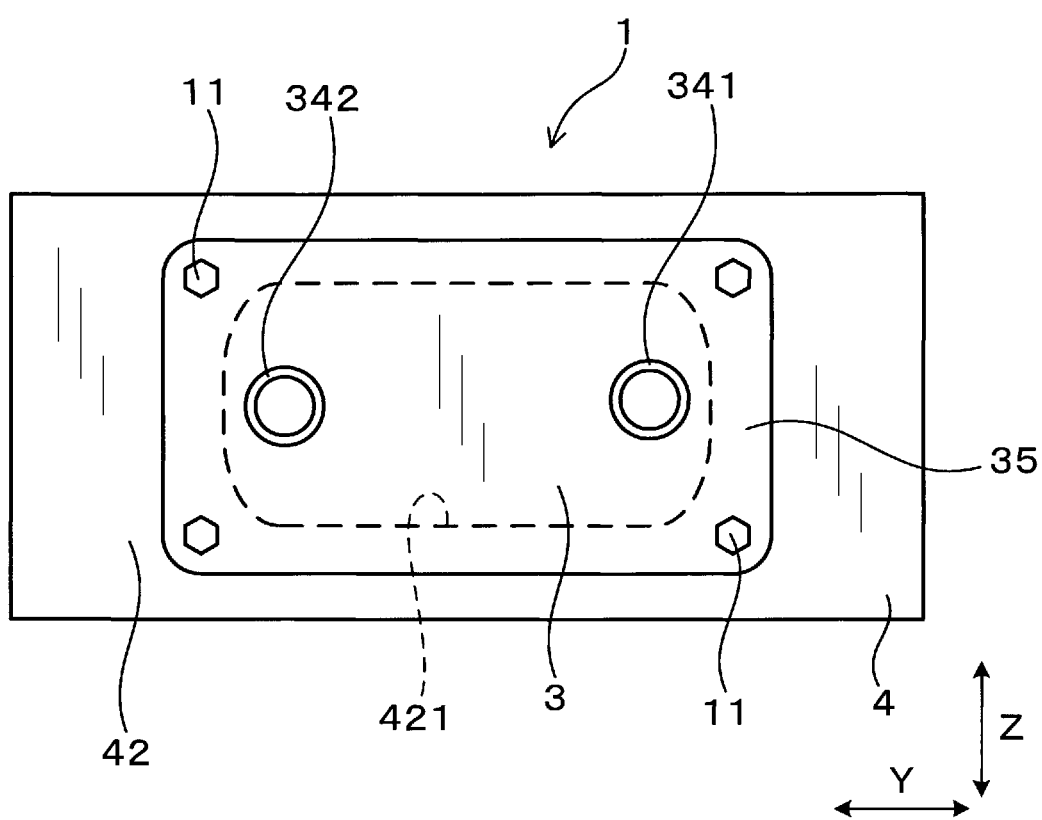
FIG. 4 is an end view of the electric power conversion apparatus according to the first embodiment along the arrow IV in FIG. 1.

In a front wall 42 of the case 4, there is formed an opening 421. As shown in FIGS. 1, 2 and 4, the flow path forming component 3 has a flange 35 formed therein; the flange 35 is arranged to abut an outer surface of the front wall 42 of the case 4. Moreover, the flange 35 has insertion holes (or through-holes) formed therein. On the other hand, the front wall 42 of the case 4 has female threaded holes formed therein. In fixing the flow path forming component 3 to the case 4, the bolts (i.e., fastening members) 11 are respectively inserted through the insertion holes formed in the flange 35 and fastened into the female threaded holes formed in the front wall 42 of the case 4.

In addition, in the present embodiment, as shown in FIG. 4, the number of the fastening members 11 is set to four. Accordingly, there are formed four insertion holes respectively in four corner portions of the flange 35 of the flow path forming component 3. However, it should be noted that the number of the fastening members 11 may be set to any other suitable number.

As shown in FIGS. 1 and 2, the front end surface of the semiconductor module-cooler unit 2 abuts the rear end surface of the flow path forming component 3 that is fixed to the case 4 as described above. Therefore, the semiconductor module-cooler unit 2 is compressed in the stacking direction X by the pressure that is applied by the pressure-applying member 5 to the semiconductor module-cooler unit 2 from the rear side Xr toward the front side Xf in the stacking direction X. Consequently, in the semiconductor module-cooler unit 2, both major surfaces of each of the semiconductor modules 21 are respectively brought into pressed contact with one adjacent pair of the cooling pipes 221 of the cooler 22. As a result, it becomes possible to improve the performance of cooling the semiconductor modules 21 by the cooler 22.

As shown in FIGS. 1-3, the flow path forming component 3 has a plurality of receiving portions 331 in which the electronic component main bodies 31 are respectively received. Moreover, the flow path forming component 3 also includes a metal housing 33 in which the in-component flow path 32 is formed. In addition, the housing 33 has sufficient load-withstanding strength against the load received from the semiconductor module-cooler unit 2.

In the present embodiment, each of the electronic component main bodies 31 is a reactor which includes a coil 311 and a sealing resin 312 that seals the coil 311. More specifically, the coil 311 is placed in a corresponding one of the receiving portions 331 of the housing 33 and the sealing resin 312 is filled into the corresponding receiving portion 331 to seal the coil 311. Consequently, the coil 311 is received in the corresponding receiving portion 331 of the housing 33 in a state of being sealed with the sealing resin 312. Moreover, the coil 311 has a pair of coil terminals 313 protruding outside from the sealing resin 312.

More specifically, the coil terminals 313 protrude in the protruding direction Z in which the power terminals 211 of the semiconductor modules 21 protrude. That is, the coil terminals 313 protrude in the same direction as the power terminals 211.

In the above-described manner, the electronic component main bodies 31 and the in-component flow path 32 are integrated into the flow path forming component 3.

In addition, the sealing resin 312 may be implemented by a mixture of magnetic powder and a resin. Alternatively, the sealing resin 312 may have a block-shaped magnetic core embedded therein together with the coil 311. Moreover, the reactors (i.e., the electronic component main bodies 31) have a greater mass than the semiconductor modules 21.

In the flow path forming component 3, the electronic component main bodies 31 are arranged in alignment with each other in the stacking direction X. As shown in FIG. 1, the in-component flow path 32 includes a plurality (more particularly, three in the present embodiment) of main flow paths 321 that are formed to extend parallel to major surfaces of the electronic component main bodies 31 which face in the stacking direction X. Moreover, one of the main flow paths 321 is located between the two electronic component main bodies 31 in the stacking direction X. In addition, in each of the main flow paths 321, the coolant flows from one end to the other end of the main flow path 321 in the longitudinal direction Y.

The main flow paths 321 are fluidically connected with each other by two connection flow paths 322 that are formed respectively on opposite sides of the main flow paths 321 in the longitudinal direction Y to extend in the stacking direction X.

The flow path forming component 3 also has both a coolant inlet 341 and a coolant outlet 342 formed at a front end thereof. The two connection flow paths 322 are fluidically connected respectively with the coolant inlet 341 and the coolant outlet 342.

The in-component flow path 32 formed in the flow path forming component 3 and the in-cooler flow path formed in the cooler 22 of the semiconductor module-cooler unit 2 are fluidically connected with each other at the boundary between the flow path forming component 3 and the semiconductor module-cooler unit 2 that are arranged to abut each other in the stacking direction X. More specifically, in the present embodiment, the in-component flow path 32 and the in-cooler flow path are fluidically connected with each other at two locations on the boundary which are respectively close to opposite ends of the boundary in the longitudinal direction Y.

The in-component flow path 32 has two rear openings 323 that open on the rear end surface of the flow path forming component 3. On the other hand, the in-cooler flow path has two front openings 223 that open on the front end surface of the semiconductor module-cooler unit 2. The flow path forming component 3 and the semiconductor module-cooler unit 2 are arranged to abut each other in the stacking direction X with the rear openings 323 of the in-component flow path 32 respectively superposed on the front openings 223 of the in-cooler flow path. Moreover, the flow path forming component 3 and the semiconductor module-cooler unit 2 are joined to each other by brazing, FSW (Friction Stir Welding) or the like. Consequently, the flow path forming component 3 and the semiconductor module-cooler unit 2 are mechanically connected with each other while the in-component flow path 32 and the in-cooler flow path are fluidically connected with each other.

In the above-described manner, the in-component flow path 32 and the in-cooler flow path are integrated into a single continuous flow path of the electric power conversion apparatus 1.

In operation, the coolant, which has been introduced into the in-component flow path 32 via the coolant inlet 341, flows backward in the stacking direction X through the upstream-side connection flow path 322 (i.e., the lower connection flow path 322 in FIG. 1) of the in-component flow path 32. Consequently, part of the coolant is distributed to the main flow paths 321 of the in-component flow path 32 while the remainder of the coolant further flows backward in the stacking direction X into the in-cooler flow path.

Moreover, the coolant, which has been introduced into the in-cooler flow path, flows backward in the stacking direction X through the upstream-side connection pipes 222 (i.e., the lower connection pipes 222 in FIG. 1) of the cooler 22. Consequently, the coolant having flowed into the in-cooler flow path is distributed to the cooling pipes 221 of the cooler 22.

Furthermore, the coolant, which has been introduced into the cooling pipes 221 of the cooler 22, flows in the longitudinal direction Y through the cooling pipes 221, cooling the semiconductor modules 21. Then, the coolant flows forward in the stacking direction X through the downstream-side connection pipes 222 (i.e., the upper connection pipes 222 in FIG. 1) of the cooler 22. Thereafter, the coolant flows out of the in-cooler flow path into the downstream-side connection flow path 322 (i.e., the upper connection flow path 322 in FIG. 1) of the in-component flow path 32.

On the other hand, the coolant, which has been introduced into the main flow paths 321 of the in-component flow path 32, flows in the longitudinal direction Y through the main flow paths 321, cooling the electronic component main bodies 31. Then, the coolant flows into the downstream-side connection flow path 322 of the in-component flow path 32.

Thereafter, all of the coolant, which has flowed into the downstream-side connection flow path 322 of the in-component flow path 32 either from the in-cooler flow path or from the main flow paths 321 of the in-component flow path 32, further flows forward in the stacking direction X, and finally flows out of the in-component flow path 32 via the coolant outlet 342.

In addition, the coolant may be implemented by a liquid coolant such as cooling water.

Moreover, in the present embodiment, as shown in FIG. 1, in the case 4, there are also provided both a capacitor 13 and a current sensor 14. Specifically, the capacitor 13 and the current sensor 14 are arranged respectively on opposite sides of the semiconductor module-cooler unit 2 in the longitudinal direction Y.

Next, operational effects of the electric power conversion apparatus 1 according to the present embodiment will be described.

In the electric power conversion apparatus 1, the flow path forming component 3 is fixed to the case 4. Therefore, the flow path forming component 3 is prevented from being displaced in the case 4 even when the electric power conversion apparatus 1 vibrates. Consequently, it becomes possible to secure the vibration resistance of the electric power conversion apparatus 1.

Moreover, in the electric power conversion apparatus 1, it is unnecessary to apply pressure between the electronic component main bodies 31 and the in-component flow path 32 for cooling the electronic component main bodies 31. In other words, it is possible to cool the electronic component main bodies 31 without applying pressure to the flow path forming component 3. Consequently, it becomes unnecessary to provide the pressure-applying member 5 on each side of the semiconductor module-cooler unit 2 in the stacking direction X. That is, it becomes possible to provide the pressure-applying member 5 only on the opposite side of the semiconductor module-cooler unit 2 to the flow path forming component 3 in the stacking direction X. As a result, it becomes possible to minimize the size of the electric power conversion apparatus 1.

Furthermore, in the electric power conversion apparatus 1, the pressure-applying member 5, the semiconductor module-cooler unit 2 and the flow path forming component 3 are arranged in alignment with each other in the stacking direction X. Consequently, it becomes possible for the pressure-applying member 5 to apply pressure to the semiconductor module-cooler unit 2 in the stacking direction X, thereby improving the efficiency of cooling the semiconductor modules 21 by the cooler 22.

Furthermore, in the electric power conversion apparatus 1, the in-cooler flow path formed in the cooler 22 and the in-component flow path 32 formed in the flow path forming component 3 are fluidically connected with each other in the stacking direction X. Consequently, it becomes unnecessary to provide both a coolant inlet and a coolant outlet for each of the in-cooler flow path and the in-component flow path 32 individually. That is, it becomes possible to provide both the coolant inlet 341 and the coolant outlet 342 only for the in-component flow path 32. In addition, since the semiconductor module-cooler unit 2 and the flow path forming component 3 are arranged in alignment with each other in the stacking direction X, it becomes possible to fluidically connect the in-cooler flow path and the in-component flow path 32 in the stacking direction X without increasing the overall length of the electric power conversion apparatus 1 in the stacking direction X. As a result, it becomes possible to facilitate minimization of the size of the electric power conversion apparatus 1.

In the present embodiment, the flow path forming component 3 is arranged to abut the front end surface of the semiconductor module-cooler unit 2 and fastened to the case 4 by the bolts (i.e., fastening members) 11. Moreover, the fastening direction of the bolts 11 is toward the rear side Xr in the stacking direction X. Consequently, it becomes possible to easily and reliably assemble the electric power conversion apparatus 1.

More specifically, the electric power conversion apparatus 1 may be assembled by: (1) placing the pressure-applying member 5, the semiconductor module-cooler unit 2 and the flow path forming component 3 in the case 4 so as to have them aligned with each other in the stacking direction X; and then (2) fastening the bolts 11 respectively through the insertion holes formed in the flange 35 of the flow path forming component 3 into the female threaded holes formed in the front wall 42 of the case 4. In this case, since the fastening direction of the bolts 11 is toward the rear side Xr in the stacking direction X, the pressure-applying member 5 is elastically compressed during the fastening of the blots 11. Consequently, it becomes possible to perform, at the same time, both the process of assembling the electric power conversion apparatus 1 and the process of setting the pressure-applying member 5 to apply pressure to the semiconductor module-cooler unit 2.

Moreover, since the fastening direction of the bolts 11 (i.e., toward the rear side Xr in the stacking direction X) is opposite to the pressure application direction of the pressure-applying member 5 (i.e., toward the front side Xf in the stacking direction X), it is possible to bear the pressure applied by the pressure-applying member 5 with the axial force of the bolts 11. Consequently, it becomes possible to secure the durability of the electric power conversion apparatus 1.

To sum up, according to the present embodiment, it becomes possible to provide the electric power conversion apparatus 1 which is high in both vibration resistance and cooling efficiency and small in size.

Second Embodiment

An electric power conversion apparatus 1 according to the second embodiment has a similar structure to the electric power conversion apparatus 1 according to the first embodiment. Therefore, only the differences therebetween will be described hereinafter.

Figure 5:
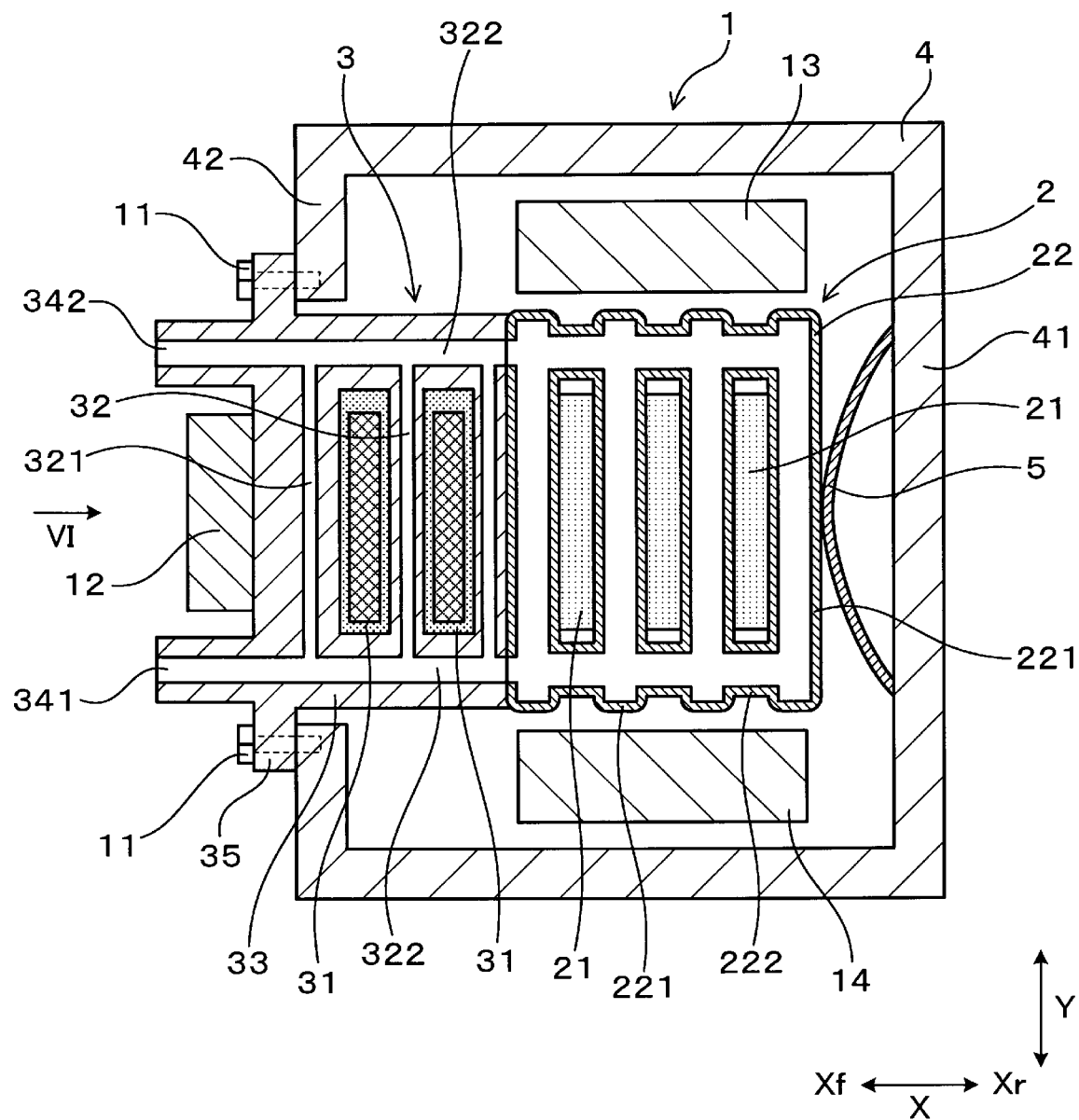
FIG. 5 is a schematic cross-sectional view illustrating the overall structure of an electric power conversion apparatus according to a second embodiment.
Figure 6:
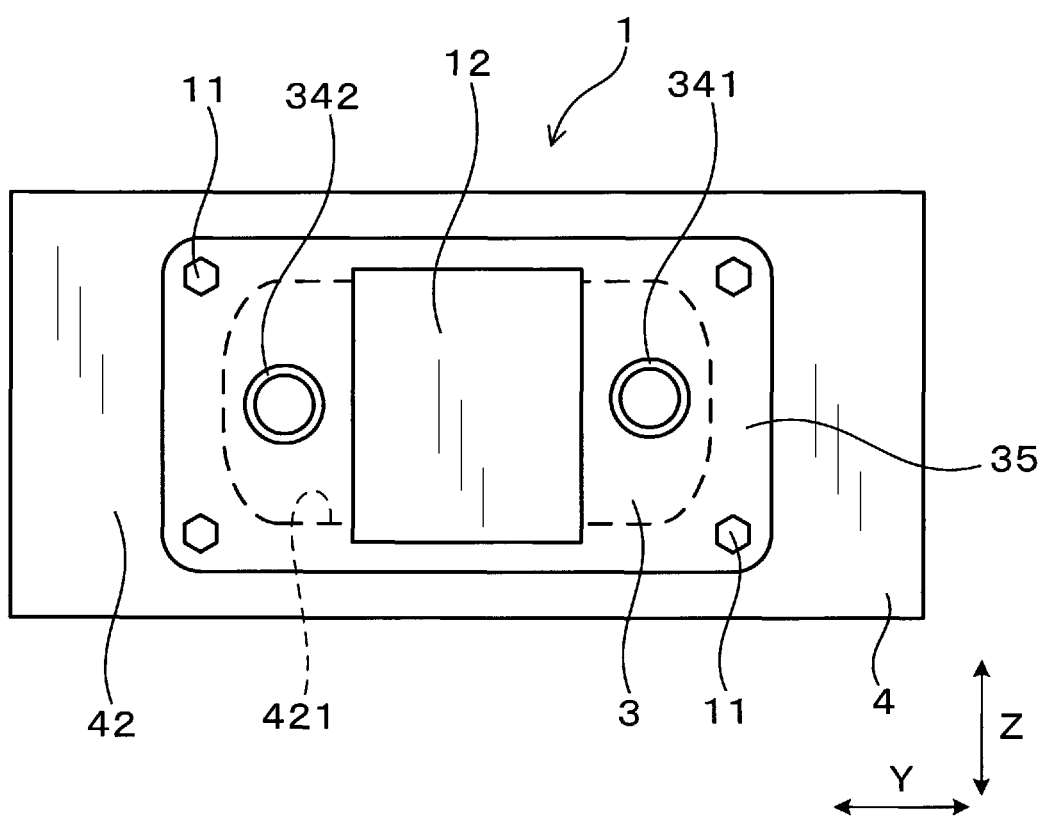
FIG. 6 is an end view of the electric power conversion apparatus according to the second embodiment along the arrow VI in FIG. 5.

As shown in FIGS. 5 and 6, the electric power conversion apparatus 1 according to the present embodiment further includes an external electronic component 12 in comparison with the electric power conversion apparatus 1 according to the first embodiment.

The external electronic component 12 is, for example, a DC-to-DC converter. The external electronic component 12 is arranged outside the flow path forming component 3 to abut an outer surface of the flow path forming component 3. Moreover, at least part of the in-component flow path 32 is opposed to the external electronic component 12 with a wall portion (more particularly, the flange 35 in the present embodiment) of the flow path forming component 3 interposed therebetween.

Specifically, in the present embodiment, the external electronic component 12 is arranged to abut a front end surface (i.e., an outer surface of the flange 35) of the flow path forming component 3. More specifically, the external electronic component 12 is arranged in surface contact with a part of the front end surface of the flow path forming component 3; the part of the front end surface is located between the coolant inlet 341 and the coolant outlet 342 in the longitudinal direction Y. Consequently, that one of the main flow paths 321 of the in-component flow path 32 which is located most forward in the stacking direction X is opposed to the external electronic component 12 with the flange 35 interposed therebetween.

The electric power conversion apparatus 1 according to the present embodiment also has the operational effects described in the first embodiment.

Moreover, in the present embodiment, it is possible to cool the external electronic component 12 using the coolant flowing in the in-component flow path 32. Consequently, it becomes unnecessary to provide any additional cooler for cooling the external electronic component 12. As a result, it becomes possible to minimize both the parts count and the size of the electric power conversion apparatus 1.

In addition, in the present embodiment, the external electronic component 12 is arranged outside the case 4. However, the external electronic component 12 may alternatively be arranged inside the case 4. For example, though not shown in the figures, the external electronic component 12 may be arranged to abut a part of the outer surface of the flow path forming component 3 which is located inside the case 4 and faces in the longitudinal direction Y. In this case, one of the connection flow paths 322 of the in-component flow path 32 would be opposed to the external electronic component 12 with a wall portion of the flow path forming component 3 interposed therebetween.

Third Embodiment

An electric power conversion apparatus 1 according to the third embodiment has a similar structure to the electric power conversion apparatus 1 according to the second embodiment. Therefore, only the differences therebetween will be described hereinafter.

Figure 7:
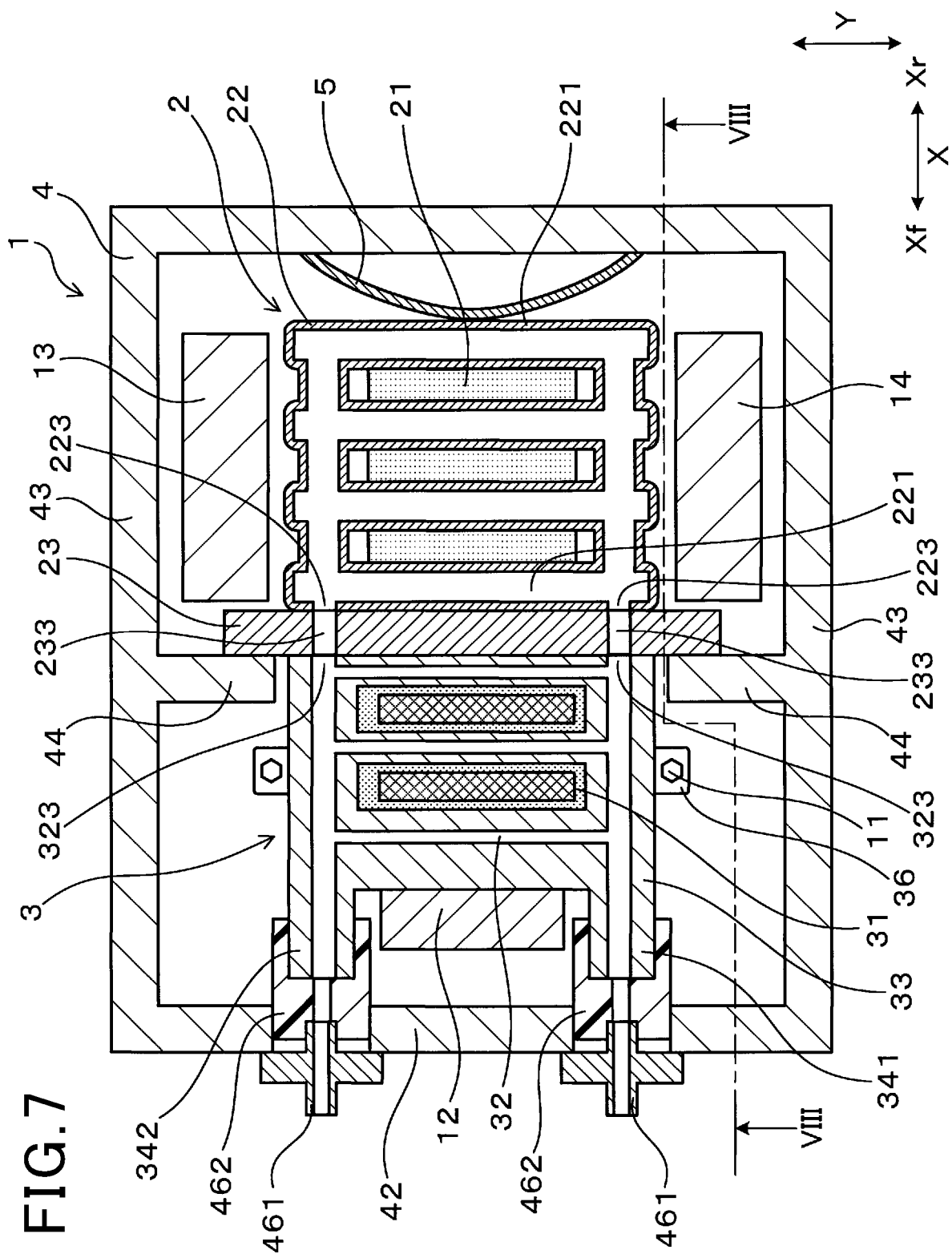
FIG. 7 is a schematic cross-sectional view illustrating the overall structure of an electric power conversion apparatus according to a third embodiment.
Figure 8:
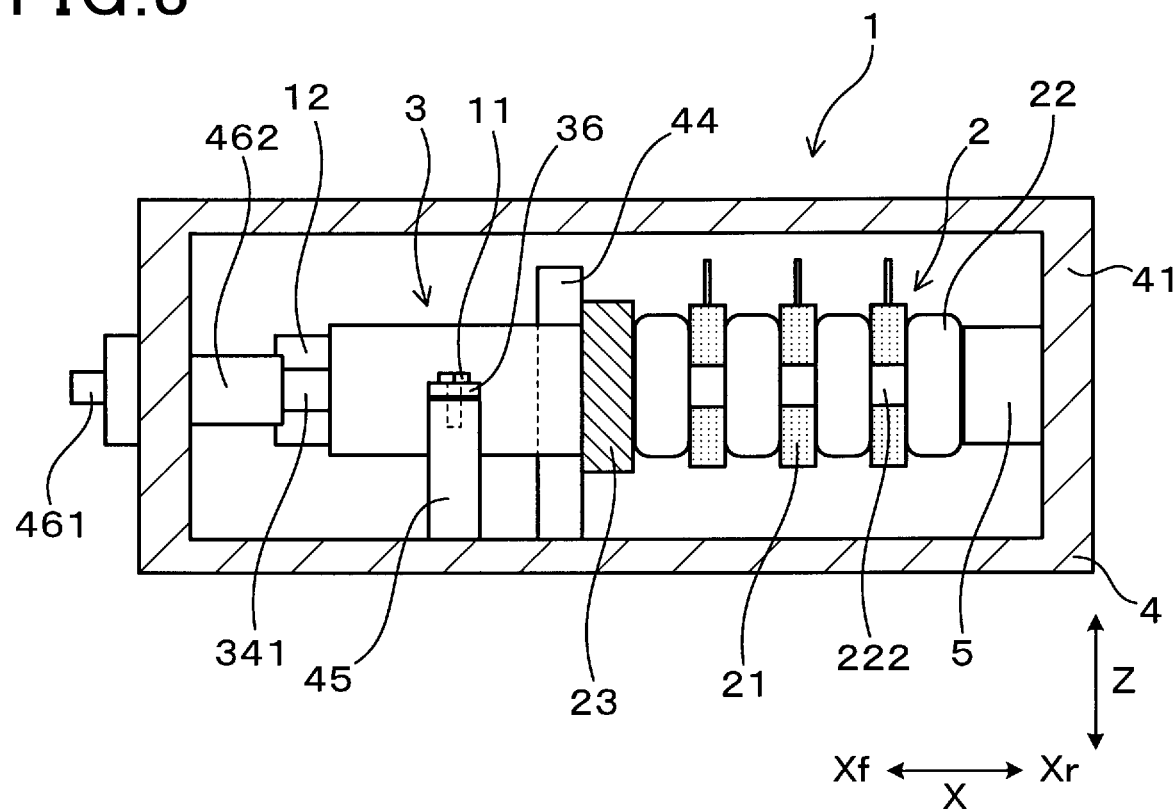
FIG. 8 is a cross-sectional view of the electric power conversion apparatus according to the third embodiment taken along the line VIII-VIII in FIG. 7.
Figure 9:
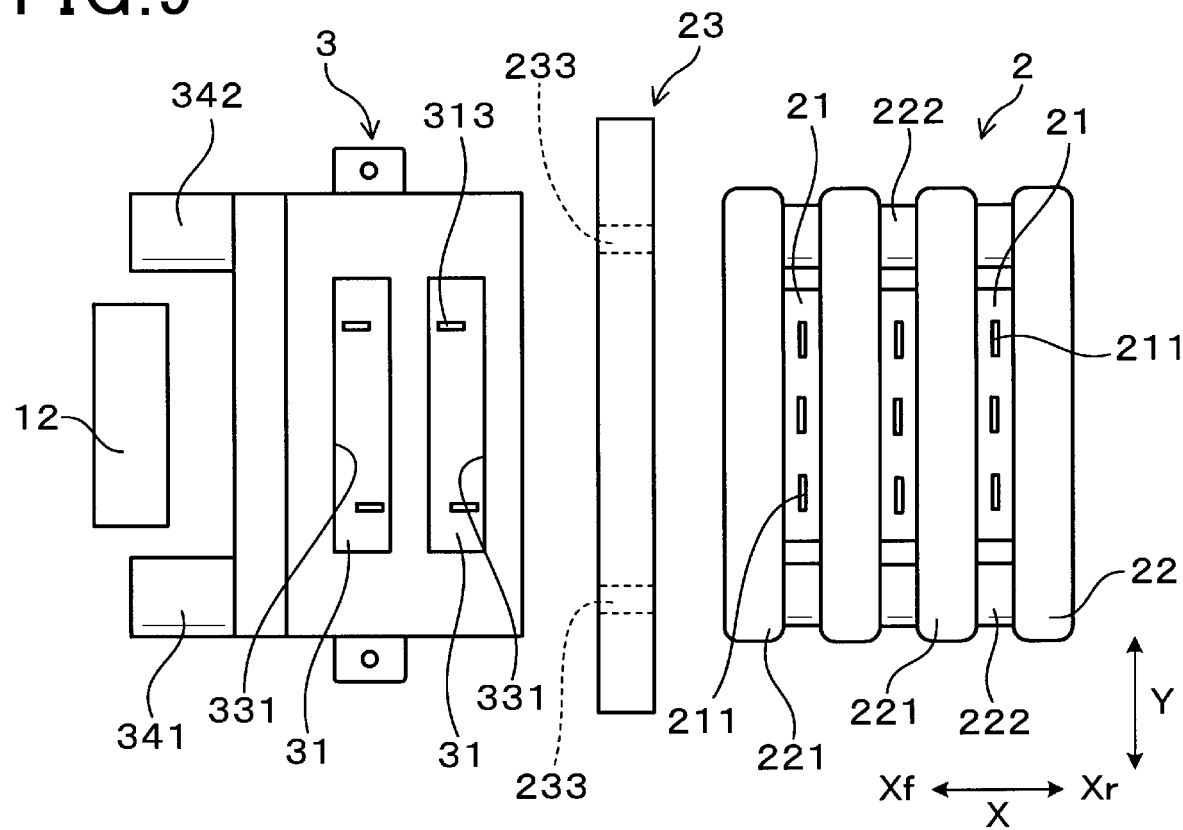
FIG. 9 is a plan view of a semiconductor module-cooler unit, a flow path forming component and an external electronic component, all of which are employed in the electric power conversion apparatus according to the third embodiment.

As shown in FIGS. 7-9, the electric power conversion apparatus 1 according to the present embodiment further includes a top plate 23 in comparison with the electric power conversion apparatus 1 according to the second embodiment.

The top plate 23 is arranged in front of the semiconductor module-cooler unit 2 so as to have its major surfaces facing respectively toward the front side Xf and the rear side Xr in the stacking direction X. Moreover, the top plate 23 abuts internal walls 44 of the case 4 from the rear side Xr in the stacking direction X.

Specifically, in the present embodiment, the top plate 23 is arranged to abut that one of the cooling pipes 221 of the cooler 22 which is located at a front end of the semiconductor module-cooler unit 2. The top plate 23 is formed, for example, of a metal plate; thus the top plate 23 has sufficient rigidity against the pressure applied by the pressure-applying member 5. In addition, it is preferable for the top plate 23 to have both a larger length in the longitudinal direction Y and a larger width in the protruding direction Z than the cooling pipes 221 of the cooler 22.

Moreover, in the present embodiment, the top plate 23 is joined, for example by brazing, to an outer surface of the cooling pipe 221 located at the front end of the semiconductor module-cooler unit 2. The top plate 23 has two through-holes 233 that are formed, respectively at two positions corresponding to the front openings 223 of the in-cooler flow path formed in the cooler 22, to penetrate the top plate 23 in the stacking direction X.

As shown in FIG. 7, the top plate 23 is arranged to abut and joined to the front end surface of the semiconductor module-cooler unit 2 (i.e., the outer surface of the cooling pipe 221 located at the front end of the semiconductor module-cooler unit 2) with the through-holes 233 of the top plate 23 respectively superposed on the front openings 223 of the in-cooler flow path.

The top plate 23 is interposed between the semiconductor module-cooler unit 2 and the flow path forming component 3 in the stacking direction X. As shown in FIGS. 7 and 8, the top plate 23 is arranged to have its front surface abutting the rear end surface of the flow path forming component 3 and its through-holes 233 respectively superposed on the rear openings 323 of the in-component flow path 32. Moreover, in the present embodiment, the top plate 23 is also joined, for example by brazing, to the rear end surface of the flow path forming component 3.

The case 4 has a pair of internal walls 44 that are formed, at a position between the rear wall 41 and the front wall 42 of the case 4 in the stacking direction X, to extend perpendicular to the stacking direction X. More specifically, the case 4 has a pair of side walls 43 formed respectively at opposite ends thereof in the longitudinal direction Y. The internal walls 44 are formed to protrude, respectively from the side walls 43 of the case 4, inward in the longitudinal direction Y. Moreover, part of the flow path forming component 3 is arranged between the internal walls 44 of the case 4.

Front surfaces of a pair of end portions of the top plate 23, which are opposite to each other in the longitudinal direction Y, respectively abut rear surfaces of the pair of internal walls 44 of the case 4. Consequently, the semiconductor module-cooler unit 2 is placed in a state of being supported by the internal walls 44 of the case 4 via the top plate 23 from the front side Xf and subject to the pressure applied by the pressure-applying member 5 from the rear side Xr.

In the present embodiment, the entire flow path forming component 3 is located inside the case 4. Moreover, as shown in FIGS. 7 and 8, the flow path forming component 3 is fixed to the case 4 by a plurality of bolts 11. However, the fastening direction of the blots 11 coincides with the protruding direction Z, not with the stacking direction X as in the first and second embodiments.

More specifically, in the present embodiment, the case 4 has seat portions 45 provided on a bottom wall thereof. On the other hand, the flow path forming component 3 has seating portions 36 placed respectively on the seat portions 45 of the case 4 in the protruding direction Z. The bolts 11 are respectively inserted through insertion holes formed in the seating portions 36 of the flow path forming component 3 and fastened into female threaded holes formed in the seat portions 45 of the case 4. Consequently, the flow path forming component 3 is fixed to the case 4 by the bolts 11 in the protruding direction Z.

Moreover, in the present embodiment, as shown in FIGS. 7 and 8, the coolant inlet 341 and the coolant outlet 342 are also located inside the case 4. A pair of protruding tubes 461 are mounted to the front wall 42 of the case 4 so as to be respectively in alignment with the coolant inlet 341 and the coolant outlet 342 in the stacking direction X. The protruding tubes 461 are fluidically connected respectively with the coolant inlet 341 and the coolant outlet 342 via connection pipes 462.

The external electronic component 12 is arranged outside the flow path forming component 3 to abut an outer surface of the flow path forming component 3, as in the second embodiment. However, in the present embodiment, as described above, the entire flow path forming component 3 is located inside the case 4; thus the external electronic component 12, which is arranged to abut the outer surface of the flow path forming component 3, is also located inside the case 4, unlike in the second embodiment.

The external electronic component 12 is a DC-to-DC converter, as in the second embodiment. In addition, it should be noted that the electric power conversion apparatus 1 according to the present embodiment may be modified to have no external electronic component 12 arranged to abut the outer surface of the flow path forming component 3.

The electric power conversion apparatus 1 according to the present embodiment also has the operational effects described in the first embodiment.

Moreover, in the present embodiment, the electric power conversion apparatus 1 includes the top plate 23 that is arranged to have its end portions in the longitudinal direction Y respectively abutting the rear surfaces of the internal walls 44 of the case 4. Consequently, it becomes possible to prevent the pressure applied by the pressure-applying member 5 to the semiconductor module-cooler unit 2 from being transmitted to the flow path forming component 3. As a result, the degree of freedom in selecting the manner of fixing the flow path forming component 3 to the case 4 is increased.

More specifically, if the pressure applied by the pressure-applying member 5 to the semiconductor module-cooler unit 2 could be transmitted to the flow path forming component 3, it would be necessary to fix the flow path forming component 3 to the case 4 in such a manner as to enable the flow path forming component 3 to sufficiently withstand the pressure. In contrast, in the present embodiment, it is unnecessary to take into account the pressure applied by the pressure-applying member 5 in selecting the manner of fixing the flow path forming component 3 to the case 4. That is, it is only necessary to fix the flow path forming component 3 to the case 4 in such a manner as to prevent the flow path forming component 3 from being detached from the case 4 due to vibration. As a result, it becomes possible to increase the degree of freedom in designing the electric power conversion apparatus 1.

While the above particular embodiments have been shown and described, it will be understood by those skilled in the art that various modifications, changes, and improvements may be made without departing from the spirit of the present disclosure.

For example, in the above-described embodiments, the flow path forming component 3 includes the metal housing 33 in which the in-component flow path 32 is formed. However, the flow path forming component 3 may include, instead of the metal housing 33, a resin housing that has the in-component flow path 32 formed therein. In this case, the joint between the semiconductor module-cooler unit 2 and the flow path forming component 3 is a metal-resin joint.

Moreover, the semiconductor module-cooler unit 2 and the flow path forming component 3 are not necessarily joined to each other. For example, instead of joining the semiconductor module-cooler unit 2 and the flow path forming component 3 to each other, a seal member (e.g., an O ring) may be employed to prevent leakage of the coolant at the boundary between the semiconductor module-cooler unit 2 and the flow path forming component 3.

What is claimed is:

1. An electric power conversion apparatus comprising:
    a semiconductor module-cooler unit including:
        a semiconductor module having a semiconductor element built therein; and
        a cooler having a plurality of cooling pipes stacked with the semiconductor module in a stacking direction to cool the semiconductor module;
    a flow path forming component including:
        an electronic component main body electrically connected with the semiconductor module and disposed in an interior of the flow path forming component; and
        an in-component flow path formed therein through which a coolant flows to cool the electronic component main body, the in-component flow path being formed integrally with the electronic component main body;
    a case that receives both the semiconductor module-cooler unit and the flow path forming component therein; and
    a pressure-applying member arranged in the case to apply pressure to the semiconductor module-cooler unit from a rear side toward a front side in the stacking direction,
    wherein the pressure-applying member, the semiconductor module-cooler unit and the flow path forming component are arranged in alignment with each other in the stacking direction,
    an in-cooler flow path, which is formed in the cooler, and the in-component flow path are flow coupled with each other in the stacking direction,
    the flow path forming component is arranged to abut a front surface of the semiconductor module-cooler unit, and fixed to the case by at least one fastening member,
    a fastening direction of the at least one fastening member is toward the rear side in the stacking direction and opposite to a pressure application direction of the pressure-applying member, and
    both the semiconductor module-cooler unit and the flow path forming component are retained between the pressure-applying member and the at least one fastening member in the stacking direction.

2. The electric power conversion apparatus as set forth in claim 1, further comprising:
    an external electronic component arranged outside the flow path forming component to abut an outer surface of the flow path forming component,
    wherein at least part of the in-component flow path is opposed to the external electronic component with a wall portion of the flow path forming component interposed therebetween.

3. The electric power conversion apparatus as set forth in claim 1, wherein the flow path forming component is formed separately from and fixed to the case.

4. The electric power conversion apparatus as set forth in claim 1, wherein the case has a front wall and a rear wall that are formed respectively at front and rear ends of the case in the stacking direction,
    the pressure-applying member is interposed, in a state of being elastically compressed in the stacking direction, between the rear wall of the case and the semiconductor module-cooler unit, and
    the flow path forming component is fixed to the front wall of the case by the at least one fastening member.

* * * * *